United States Patent [19]

Laber et al.

[11] Patent Number: 4,897,611

[45] Date of Patent: Jan. 30, 1990

[54] VERY HIGH GAIN POSITIVE FEEDBACK CMOS TRANSCONDUCTANCE AMPLIFIER

[75] Inventors: Carlos A. Laber, Los Altos; Paul R. Gray, Orinda, both of Calif.

[73] Assignee: Micro Linear Corporation, San Jose, Calif.

[21] Appl. No.: 264,401

[22] Filed: Oct. 28, 1988

[51] Int. Cl.$^4$ ............................ H03F 1/38; H03F 3/16
[52] U.S. Cl. .................................... 330/253; 330/277; 330/291
[58] Field of Search ............... 330/253, 255, 277, 291, 330/307, 311

[56] References Cited

U.S. PATENT DOCUMENTS

| 4,320,351 | 3/1982 | Brown, Jr. et al. | 330/291 X |
| 4,661,779 | 4/1987 | Okamoto | 330/311 X |
| 4,701,720 | 10/1987 | Monticelli | 330/291 X |
| 4,730,168 | 3/1988 | Senderowicz et al. | 330/255 X |

Primary Examiner—Steven Mottola
Attorney, Agent, or Firm—Limbach, Limbach & Sutton

[57] ABSTRACT

This invention is for a transconductance amplifier. The amplifier has an amplifier input and an amplifier output with an amplifier output impedance. An input stage of the amplifier has a first transconductance. An intermediate state is coupled to the amplifier output through positive feedback. The intermediate stage has a second transconductance and an intermediate stage output having an intermediate output impedance. The gain of the amplifier is a function of the first transconductance times the second transconductance times the amplifier output impedance times the intermediate output impedance.

9 Claims, 5 Drawing Sheets

VERY HIGH GAIN POSITIVE FEEDBACK CMOS TRANSCONDUCTANCE AMPLIFIER

FIELD OF THE INVENTION

This invention relates to the field of MOS amplifying circuits. More particularly, this invention relates to the field of high gain CMOS transconductance amplifiers with differential inputs having an internal positive feedback path from the output.

BACKGROUND OF THE INVENTION

For a variety of circuit applications it is desirable to have a transconductance amplifier having very high gain. In prior art circuits having differential inputs the gain of the circuit was determined by the transconductance of the input transistors $g_m$ multiplied by the impedance of the circuit at the output $r_o$, i.e. $g_m r_o$.

Other prior approaches utilized NMOS techniques thereby consuming excessive amounts of power in the circuit. Such circuits have resistance in a feedback loop with capacitance compensators. Other circuits were implemented using two gain stages, each of which were source follower/unity gain-type amplifier circuits.

SUMMARY OF THE INVENTION

This invention is for a transconductance amplifier. The amplifier has an amplifier input and an amplifier output with an amplifier output impedance. An input stage of the amplifier has a first transconductance. An intermediate stage is coupled to the amplifier output through positive feedback. The intermediate stage has a second transconductance and an intermediate stage output having an intermediate output impedance. The gain of the amplifier is a function of the first transconductance times the second transconductance times the amplifier output impedance times the intermediate output impedance.

DETAILED DESCRIPTION OF THE PREFERRED EMBODIMENT

Figure 1:
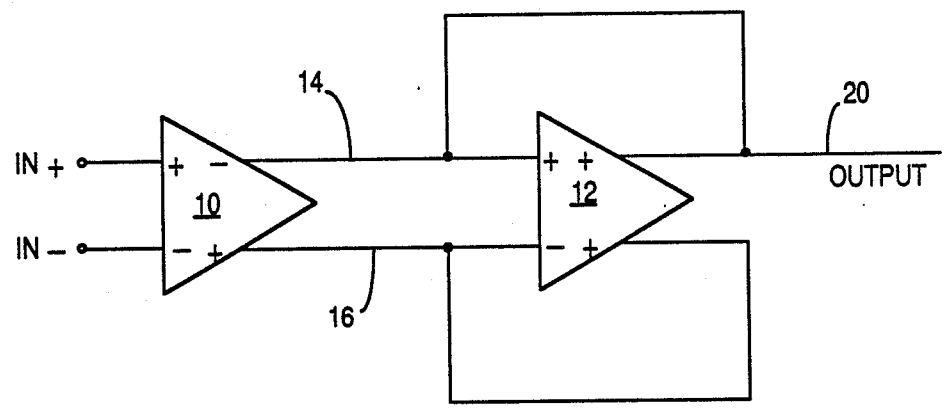
FIG. 1 shows a block diagram of the present invention.

The block diagram of FIG. 1 shows the basic operation of the present invention. A first transconductance amplifier 10 is coupled to receive a noninverting input IN+ and an inverting input IN−. The first transconductance amplifier is preferably a differential input to differential output amplifier having a negative output 14 and a positive output 16.

The negative output 14 of the first amplifier 10 is coupled to the output of the circuit 20 and to the noninverting input of a second transconductance amplifier 12. The positive output 16 of the first amplifier 10 is coupled to an internal negative feedback output of the second transconductance amplifier 12 and to the inverting input of a second amplifier 12. The second transconductance amplifier 12 is preferably a differential input to common-mode output amplifier.

Figure 2:
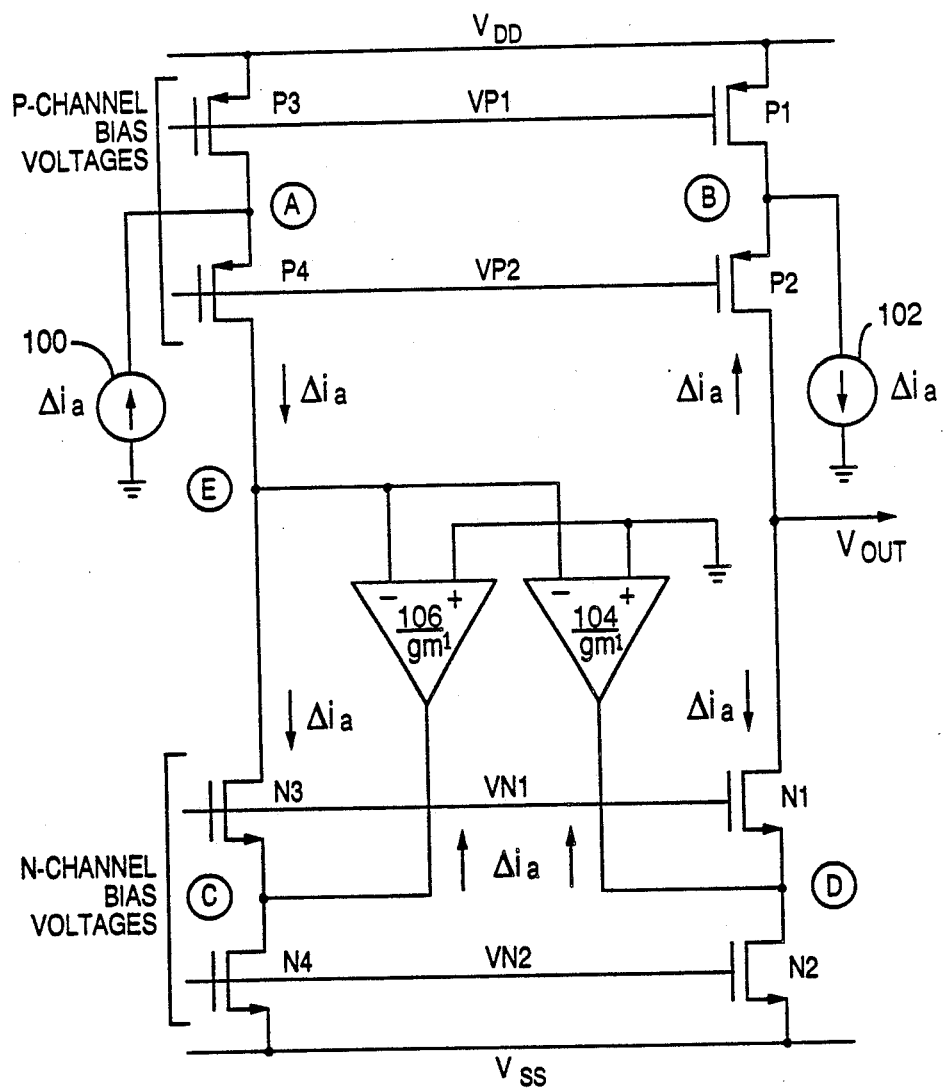
FIG. 2 shows a block diagram representation of a prior art circuit having no positive feedback.

A prior art circuit having no positive feedback is shown in FIG. 2. The circuit of FIG. 2 has a positive voltage supply $V_{DD}$ and a negative voltage supply $V_{SS}$.

In the circuit of FIG. 2 the input differential amplifier pair is not shown so that this description is simplified. Rather, the differential inputs are shown as a first current supply 100 and a second current supply 102. Each of these current supplies 100 and 102 is grounded. The first current supply 100 is coupled to the circuit at node A. The second current supply 102 is coupled to the circuit at node B.

Each half of this differential input to common-mode output amplifier is a folded cascode amplifier. The output side of the amplifier comprises a first PMOS transistor P1 having a first gate, a first drain and a first source. The gate of P1 is coupled to a first p-channel bias voltage VP1. The drain of P1 is coupled to the positive supply voltage $V_{DD}$. The source of P1 is coupled to the second current source 102.

A second PMOS transistor P2 is provided having a second gate a second source and a second drain. The gate of P2 is coupled to a second p-channel bias voltage VP2. The drain of P2 is coupled to the current source 102 and to the source of P1. The source of P2 is coupled to the output of the circuit $V_{OUT}$.

A first NMOS transistor N1 is provided having a third gate a third source and a third drain. The gate of N1 is coupled to a first n-channel bias voltage VN1. The drain of N1 is coupled to the output of the circuit $V_{OUT}$ and to the source of P2. The source of N1 is coupled to the output of a differential to common-mode amplifier 104 with a gain of $g_{ml}$.

A second NMOS transistor N2 is provided having a fourth gate a fourth source and a fourth drain. The gate of N2 is coupled to a second n-channel bias voltage VN2. The drain of N2 is coupled to the output of the amplifier 104 and to the source of N1. The source of N2 is coupled to the negative supply voltage $V_{SS}$.

The other side of the amplifier comprises a third PMOS transistor P3 having a fifth gate, a fifth drain and a fifth source. The gate of P3 is coupled to the first p-channel bias voltage VP1. The drain of P3 is coupled to the positive supply voltage $V_{DD}$. The source of P1 is coupled to the first current source 100.

A fourth PMOS transistor P4 is provided having a sixth gate a sixth source and a sixth drain. The gate of P4 is coupled to a second p-channel bias voltage VP2. The drain of P4 is coupled to the current source 100 and to the source of P3. The source of P4 is coupled to the node E, a mirror of the output of the circuit $V_{OUT}$.

A third NMOS transistor N3 is provided having a seventh gate a seventh source and a seventh drain. The gate of N3 is coupled to a first n-channel bias voltage VN1. The drain of N3 is coupled to the node E and to the source of P4. The source of N3 circuit $V_{OUT}$ is coupled to the output of a differential to common-mode amplifier 106 with a gain of $g_{ml}$.

A fourth NMOS transistor N4 is provided having a eighth gate a eighth source and a eighth drain. The gate of N4 is coupled to the second n-channel bias voltage VN2. The drain of N4 is coupled to the output of the amplifier 106 and to the source of N3. The source of N4 is coupled to the negative supply voltage $V_{SS}$.

The inverting input of amplifiers 104 and 106 are coupled to the node E. The noninverting input of amplifiers 104 and 106 are coupled to ground.

In response to a change in input voltages each of the input current sources 100 and 102 generates a differential current $\Delta i_a$. This current from current source 100 is shown to enter node A. This current from current source 102 is shown to exit node B. In the event that the input voltage swing was in the opposite direction, the direction of these currents would be reversed.

The current flowing into node A passes through P4 to node E which is the input to the amplifiers 104 and 106. Each of 104 and 106 draw the current via through their outputs. In other words, a replica current is produced at node D drawing current from the output.

The current developed in the second current source 102 is drawn from the output $V_{OUT}$. The circuit is shown having current $\Delta i_a$ leaving the output $V_{OUT}$ going up and going down. It will be understood by those of ordinary skill in the art that $2\Delta i_a$ are unaccounted for in the drawing. This current passes through the parasitic load (not shown) thereby appropriately affecting the output voltage.

The circuit of FIG. 2 operates through negative feedback to cancel the injected current at node E thereby keeping node E at virtual ground. Thus, the output $V_{OUT}$ realizes the full swing.

Figure 3:
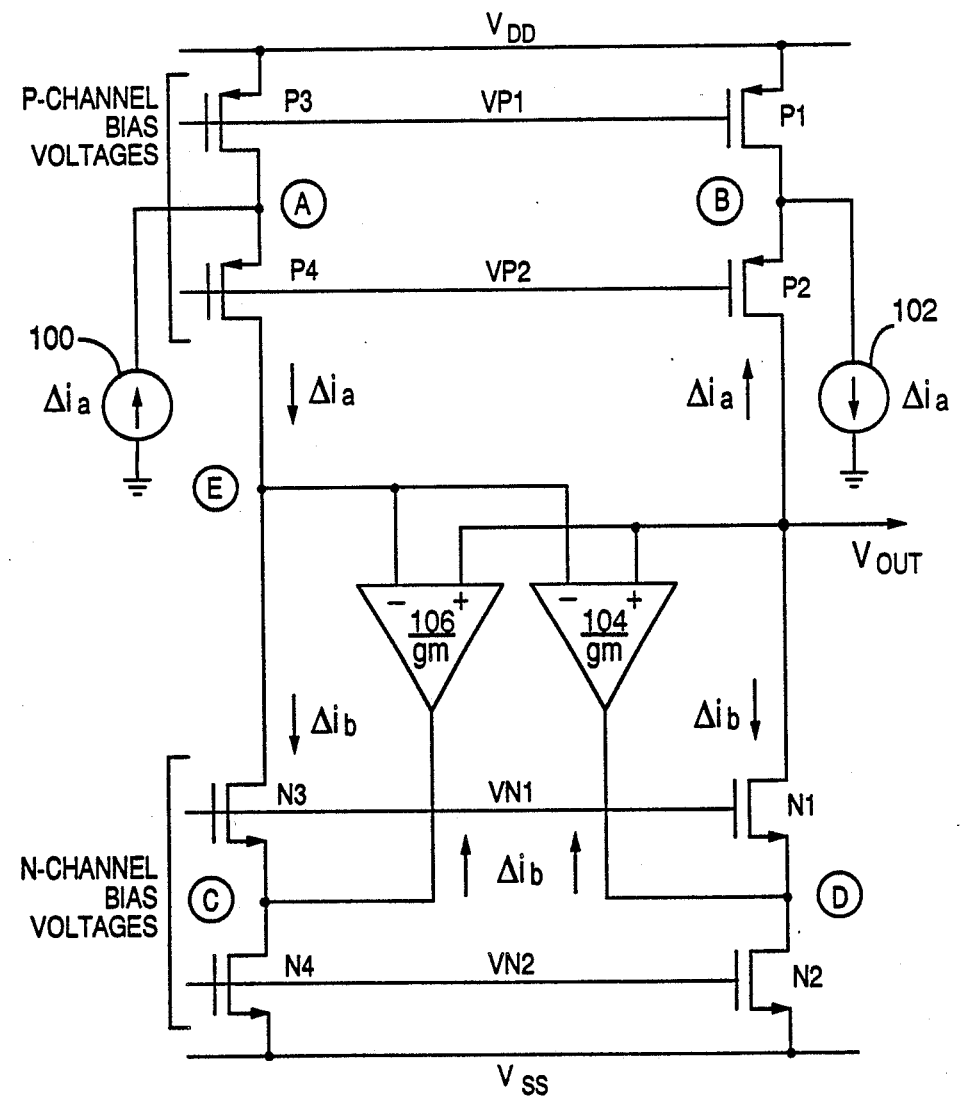
FIG. 3 shows a block diagram representation o the preferred embodiment of the present invention having positive feedback.

In contrast, the present invention utilizes positive feedback. The voltage difference between the output $V_{OUT}$ and node E are minimized. The circuit in FIG. 3 shows a block diagram representation of the circuit of the present invention utilizing positive feedback. The circuit block diagram of FIG. 3 is identical to the circuit block diagram of FIG. 2 except that the output $V_{OUT}$ is coupled to the noninverting inputs of amplifiers 104 and 106.

The change in output current is now $\Delta i_a + \Delta i_b$, where $\Delta i_b >> \Delta i_a$. The node E is forced to follow the output by an amount attenuated by the closed-loop gain of the negative feedback loop. This extra current flows through the output impedance and increases the output voltage $V_{OUT}$ even further.

Figure 4:
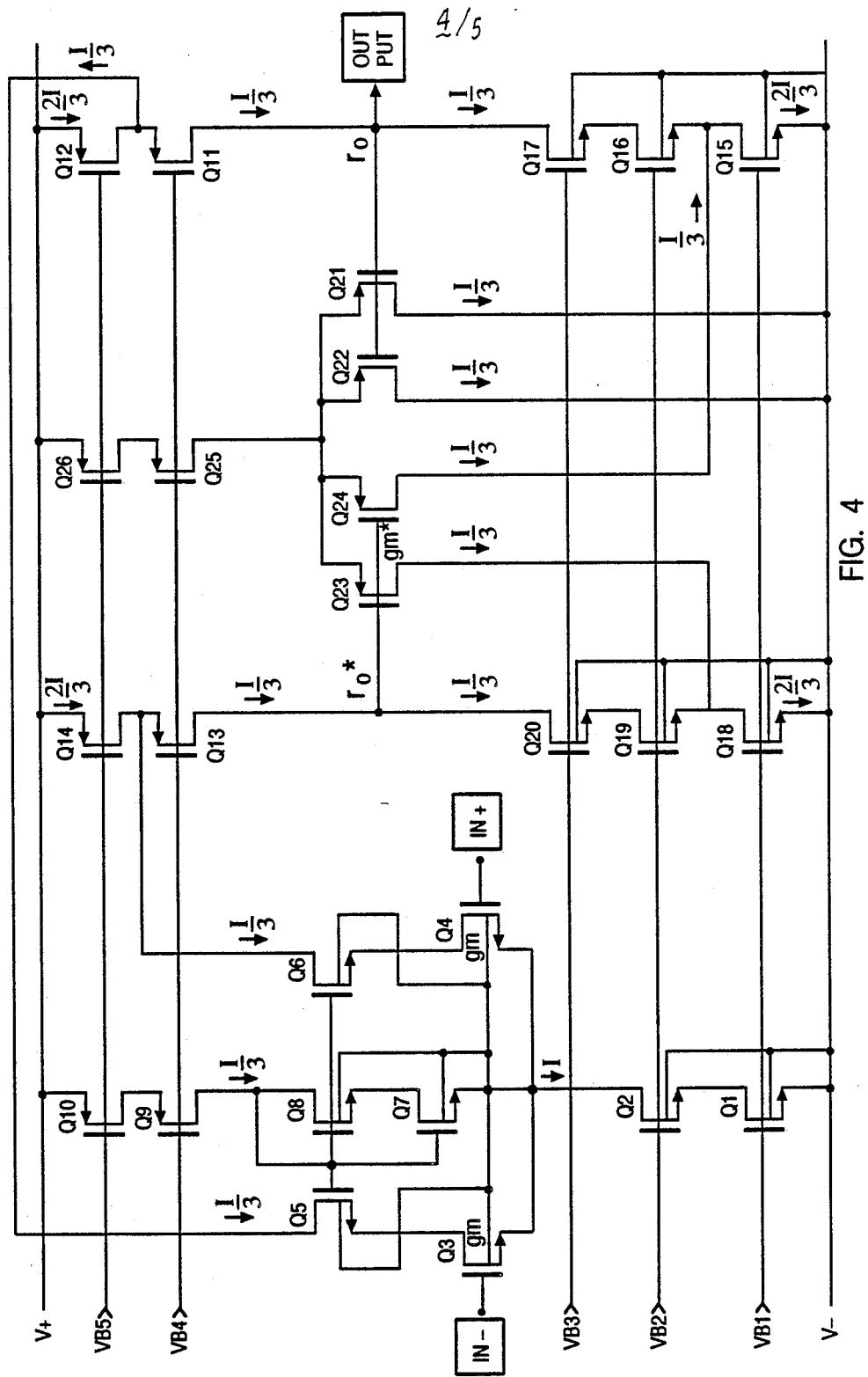
FIG. 4 shows the steady state currents in a CMOS circuit implementation utilizing the preferred embodiment of the present invention.

The circuit of the preferred embodiment is shown in FIG. 4. The circuit of FIG. 4 is a very high gain CMOS transconductance amplifier with internal positive feedback. The circuit has a positive voltage supply V+ and a negative voltage supply V−. The circuit also has five bias voltages VB1, VB2, VB3, VB4, and VB5. These bias voltages establish appropriate internal voltage levels to the circuit for proper operation.

The circuit has a negative input terminal IN− and a positive input terminal IN+. The differential inputs IN+ and IN− only signify that the voltages of these two inputs are of opposite polarity to one another. The output 20 of this transconductance amplifier may be applied as necessary to external circuitry.

The gate of NMOS transistor Q1 is coupled to the first bias voltage VB1. The channel and source of transistor Q1 are coupled to the negative supply voltage V−. The drain of transistor Q1 is coupled to the source of NMOS transistor Q2.

The substrate of transistor Q2 is coupled to the negative supply voltage V−. The gate of transistor Q2 is coupled to the second bias voltage VB2. The drain of transistor Q2 is coupled to the sources of NMOS transistors Q3, Q4 and Q7 and to the channels of each of NMOS transistors Q3, Q4, Q5, Q6, Q7, and Q8.

The gate of transistor Q3 is coupled to the input IN−. The gate of transistor Q4 is coupled to the input IN+. The drain of transistor Q3 is coupled to the source of transistor Q5. The drain of transistor Q4 is couple to the source of transistor Q6. The gate of transistor Q5 is coupled to the gates of transistor Q6, Q7, and Q8 and to the drain of transistor Q8. The source of transistor Q8 is coupled to the drain of transistor Q7.

The drain of transistor Q5 is biased by the positive voltage V+ through the channel of PMOS transistor Q12. The drain of transistor Q5 is coupled to the source of transistor Q12. The drain of transistor Q12 is coupled to the positive voltage supply V+. The drain of transistor Q6 is biased by the positive voltage supply V+ through the channel of PMOS transistor Q14. The drain of transistor Q6 is coupled to the source of transistor Q14. The drain of transistor Q14 is coupled to the positive voltage supply V+. The gate of transistor Q12 and the gate of transistor Q14 are coupled to a fifth bias voltage VB5.

The drain of transistor Q8 is biased by the positive supply of voltage V+ through the series connection of the channels of PMOS transistors Q9 and Q10. The drain of transistor Q8 is coupled to the source of transistor Q9. The drain of PMOS transistor Q9 is coupled to the source of PMOS transistor Q10. The drain of transistor Q10 is coupled to the positive supply of voltage V+. The gate of transistor Q9 is coupled to the fourth bias voltage VB4. The gate of transistor Q10 is coupled to the fifth bias supply voltage VB5.

The source of transistor Q12 is coupled to the drain of PMOS transistor Q11. The source of transistor Q11 is coupled to the output. The output is also coupled to the drain of NMOS transistor Q17. The source of transistor Q17 is coupled to the drain of NMOS transistor Q16. The source of transistor Q16 is coupled to the drain of NMOS transistor Q15. The source of transistor Q15 and the channels of transistors Q15, Q16, and Q17 are all coupled to the minus supply voltage V−.

The source of transistor Q14 is coupled to the drain of PMOS transistor Q13. The source of transistor Q13 is coupled to the mirror of the output M and the drain of NMOS transistor Q20. The source of transistor Q20 is coupled to the drain of NMOS transistor Q19. The source of transistor Q19 is coupled to the drain of NMOS transistor Q18. The source of transistor Q18 and the channels of transistors Q18, Q19, and Q20 are coupled to the negative supply voltage V−.

The gates of transistors Q15 and Q18 are coupled to the first bias voltage VB1. The gates of transistor Q16 and Q19 are coupled to the second bias voltage VB2. The gates of transistors Q17 and Q20 are coupled to the third bias voltage VB3.

The drain of PMOS transistor Q26 is coupled to the positive supply voltage V+. The source of transistor Q26 is coupled to the drain of PMOS transistor Q25.

The source of transistor Q25 is coupled to the drain of PMOS transistors Q21, Q22, Q23, and Q24. The sources of transistor Q21 and Q22 are coupled to the negative supply voltage V−. The source of transistor Q23 is coupled to the drain of transistor Q18 and the source of transistor Q19. The source of transistor Q24 is coupled to the drain of transistor Q15 and the source of transistor Q16.

The gates of transistor Q11, Q13, and Q25 are each coupled to the fourth bias voltage VB4. The gate of transistor Q26 is coupled to the fifth bias voltage BV5. The gates of transistor Q21 and Q22 are coupled to the output to provide positive feedback. The gates of transistor Q23 and Q24 are coupled to the mirror of the output M.

For equal input voltages bias voltages and power supply voltages in steady state the current passing through transistors Q1 and Q2 has a value I as shown. Transistors Q1 and Q2 in the preferred embodiment, the current passing through the three branches of the differential input circuit are each the same. Thus, the currents through the transistor pair Q3 and Q5 is I/3, the current through the transistor pair Q4 and Q6 is I/3, and the current through the transistor pair Q7 and Q8 is I/3. For other embodiments of this invention may create different ratios of currents for these three branches may be used.

The current passing through the series branch of transistors Q3 and Q5 comes from the positive supply voltage V+ through transistor Q12. The current through transistor Q12 has a value of 2I/3 as shown in FIG. 4. That current splits evenly having I/3 go into the drain of transistor Q5 and the remaining I/3 of current goes through the series path including transistors Q11, Q17, Q16, and Q15 to the negative supply voltage V−.

The steady state current through each of the transistors Q21, Q22, Q23, and Q24 is I/3. The current passing through transistor Q24 enters the drain of transistor Q15. The current through transistor Q15 is the sum of the currents passing through transistor Q16 and Q24. The current through transistor Q15 is 2I/3. The remaining steady state currents are shown on the Figure designated as a function of the letter I.

The third bias voltage VB3 and transistors Q20 and Q17 are provided for circuits utilizing 10 volts. If the positive voltage supply V+− the negative voltage supply V− is approximately 5 volts then the third bias voltage VB3 and transistors Q20 and Q17 are not needed. These three circuit elements (VB3, Q20 and Q17) provide what is called an impact ionization shield.

Figure 5:
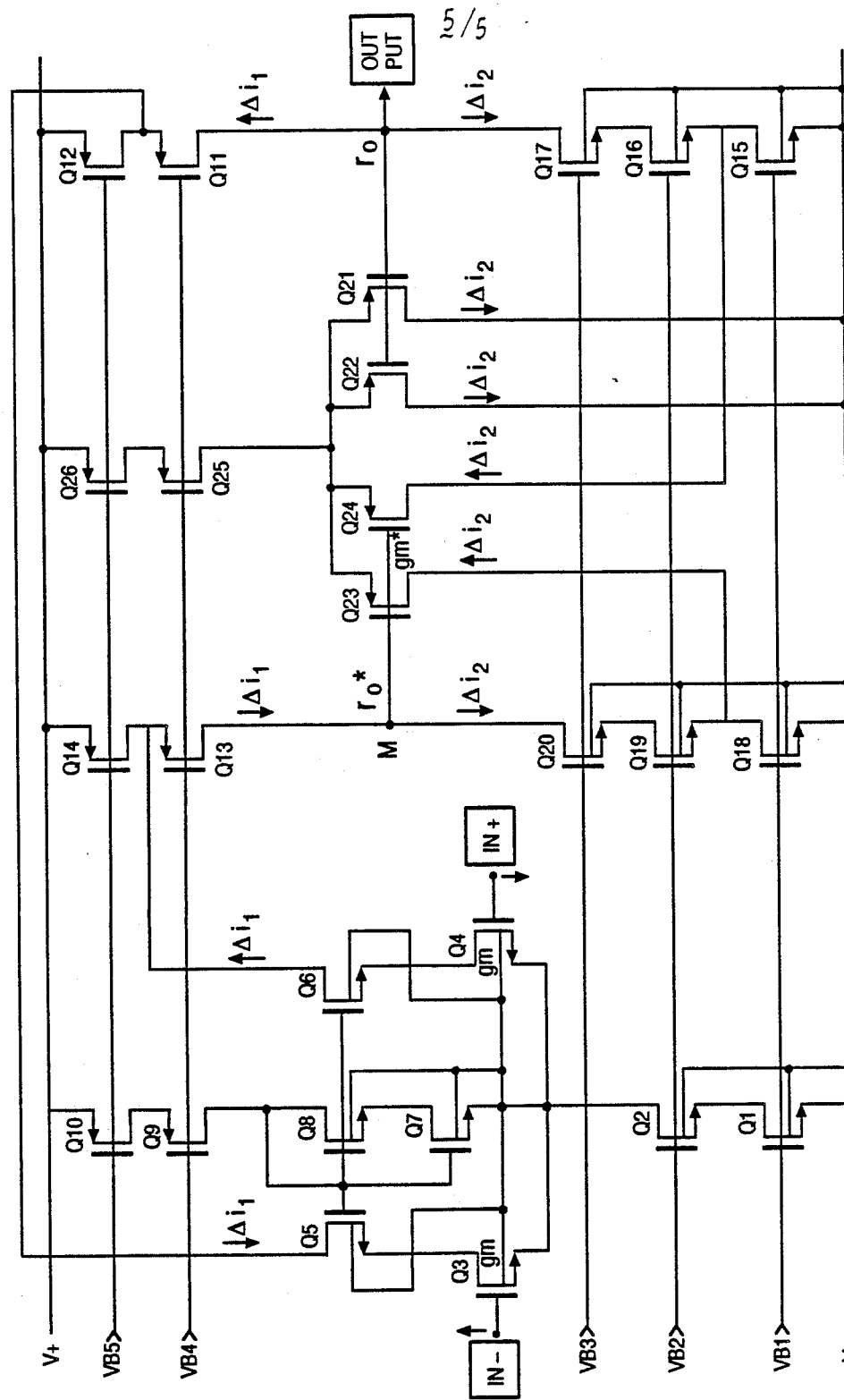
FIG. 5 shows the difference currents in the CMOS circuit implementation of FIG. 4 resulting from a change in input voltage condition.

In FIG. 5 a change in the input voltages is shown where IN− increases and IN+ has a complementary decrease signified by an up arrow at the IN− input and a down arrow at the IN+ input. As the voltage on the negative input IN− increases, the increased voltage on the gate of transistor Q3 increases the conductance through transistor Q3 as a function of the transconductance $g_m$ changing the current through the series path of transistors Q3 and Q5 by an amount $\Delta i_1$ as shown. Similarly, as the voltage on the input IN+ decreases, the conductance of transistor Q4 decreases causing an appropriate decrease $\Delta i_1$ in the current through the series path of transistors Q4 and Q6 as shown.

The change in current $\Delta i_1$ through the series path of transistors Q3 and Q4 is translated through the series path directly to the output through transistor Q11. The decrease in current $\Delta i_1$ through the series path Q4 and Q6 is translated to the mirrored output M through transistor Q13 as shown. The change in current in transistor Q13 changes the current through the series of transistors Q18, Q19, and Q20 changing the voltage on the mirrored output M. Therefore, the current through transistors Q23 and Q24 changes according to the mirrored output impedance $r_0^*$ multiplied by the transconductance of transistors Q23 and Q24 $g_m^*$, i.e. $\Delta i_2$.

The change in current through transistor Q24 $\Delta i_2$ comes from the output of the circuit through transistors Q17 and Q16. Accordingly, the change in the output voltage for this change in the differential input voltage is proportional to $\Delta i_1 + \Delta i_2$, i.e., the sum of a change in currents through transistor Q11 and through the series path Q17 and Q16.

Without the connection between the output and the gates of transistors Q21 and Q22, the gain of this differential input transconductance amplifier would be the gains of transistors Q3 and Q4 $g_m$ times the output impedance of the circuit rhd o, i.e. $g_m r_o$.

Because of the positive feedback from the output to transistors Q1 and Q22, the change in the output current, unlike prior art circuits, is not driven solely by the transconductance $g_m$ and the output impedance. Rather, the gain of the circuit according to the present invention is the prior art gain $g_m r_o$ times one half the gain of the mirrored output impedance times the gain of transistors Q23 and Q24. Accordingly, the gain for this circuit of the present invention is approximately one half $g_m r_o$ $g_m^* r_o^*$.

Another way of looking at the advantages achieved according to the present invention is that the output impedance is bootstrapped through the positive feedback. Under this view of the present invention the new output impedance rather than being $r_0$ is now one half $r_0 g_m^* r_o^*$.

What is claimed is:

1. A transconductance amplifier with a gain having an amplifier input, an amplifier output and an amplifier output impedance, said amplifier comprising:
   a. a first amplification means coupled to said amplifier input and having a first transconductance; and
   b. a second amplification means having a second amplifier input, a second transconductance and a second output with a second output impedance; and
   c. positive feedback means for coupling the output of said amplifier to the second amplifier input of said second amplification means,
wherein the gain of the amplifier is a function of the first transconductance times the second transconductance times the amplifier output impedance times the second output impedance.

2. The transconductance amplifier according to claim 1 wherein the amplifier is manufactured as a CMOS integrated circuit.

3. The transconductance amplifier according to claim 2 wherein the first amplification means is a differential to differential amplifier.

4. The transconductance amplifier according to claim 3 wherein the second amplification means is a differential to common-mode amplifier.

5. The transconductance amplifier according to claim 3 wherein the second amplification means output is coupled to receive a signal responsive to said amplifier input.

6. The transconductance amplifier according to claim 1 wherein the second amplifier stage has an output that is a mirror to the amplifier output.

7. A CMOS transconductance type amplifier of the type having a differential input stage having a first transconductance and an amplifier output having an amplifier output impedance wherein the improvement comprises:
   a. a second amplifier stage having a second input, a second transconductance and a second output with a second output impedance; and
   b. a positive feedback path coupling the amplifier output to the second input, whereby the gain of the transconductance amplifier is proportional to the first transconductance times the second transconductance times the amplifier output impedance times the second output impedance.

8. The transconductance amplifier according to claim 7 wherein the first amplification means is a differential to differential amplifier.

9. The transconductance amplifier according to claim 8 wherein the second amplification means is a differential to common-mode amplifier.

* * * * *

UNITED STATES PATENT AND TRADEMARK OFFICE
CERTIFICATE OF CORRECTION

PATENT NO. : 4,897,611

DATED : January 30, 1990

INVENTOR(S) : Carlos A. Laber, et al

It is certified that error appears in the above-identified patent and that said Letters Patent is hereby corrected as shown below:

In the abstract:

Line 5, replace "state" with --stage--.

In the specification:

Col. 1, line 45, replace "o" with --of--.

Col. 2, line 60, delete "circuit $V_{out}$".

Col. 3, line 13, replace "via" with --$\Delta i_a$--.

Col. 6, line 8, after circuit, delete "rhd o" and insert --$r_o$--.

Signed and Sealed this

Fifteenth Day of January, 1991

Attest:

HARRY F. MANBECK, JR.

*Attesting Officer*　　*Commissioner of Patents and Trademarks*